(12) United States Patent
Lee et al.

(10) Patent No.: US 11,181,824 B2
(45) Date of Patent: Nov. 23, 2021

(54) SEMICONDUCTOR APPARATUS AND METHOD FOR BAKING COATING LAYER

(71) Applicant: TAIWAN SEMICONDUCTOR MANUFACTURING COMPANY LTD., Hsinchu (TW)

(72) Inventors: Yung-Yao Lee, Hsinchu County (TW); Chen Yi Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/732,183

(22) Filed: Dec. 31, 2019

(65) Prior Publication Data

US 2021/0200096 A1    Jul. 1, 2021

(51) Int. Cl.
*H01L 21/67* (2006.01)
*G03F 7/16* (2006.01)
*G03F 7/38* (2006.01)
*G03F 7/40* (2006.01)

(52) U.S. Cl.
CPC ............... *G03F 7/168* (2013.01); *G03F 7/38* (2013.01); *G03F 7/40* (2013.01); *H01L 21/67225* (2013.01)

(58) Field of Classification Search
CPC ......... H01L 21/67109; H01L 21/67225; H01L 21/67115; H01L 21/469; G03F 7/168; G03F 7/38; G03F 7/40
USPC ...................................... 355/27, 30; 118/666
See application file for complete search history.

(56) References Cited

U.S. PATENT DOCUMENTS

| 7,978,304 | B2* | 7/2011 | Emoto | G03F 7/70841 355/53 |
| 8,238,731 | B2* | 8/2012 | Nakajima | H01L 21/67115 392/416 |
| 2005/0085094 | A1* | 4/2005 | Yoo | H01L 21/31138 438/770 |
| 2006/0032072 | A1* | 2/2006 | Yamaga | H01L 21/67109 34/72 |

* cited by examiner

*Primary Examiner* — Hung Nguyen
(74) *Attorney, Agent, or Firm* — WPAT, P.C., Intellectual Property Attorneys; Anthony King

(57) ABSTRACT

The present disclosure provides an apparatus for fabricating a semiconductor structure, including an air flow redistribution member configured to receive an air flow at a first end and eject the air flow at a second end. The air flow redistribution member includes a first air flow redistribution plate and a second air flow redistribution plate between the first air flow redistribution plate and the second end.

20 Claims, 11 Drawing Sheets

SEMICONDUCTOR APPARATUS AND METHOD FOR BAKING COATING LAYER

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

As semiconductor industry continues to evolve, advanced photolithography techniques have been widely used in integrated circuit fabrication operation. Photolithography operations may include techniques pertinent to coating a photoresist layer on a wafer and exposing the wafer to an exposing source.

Masks can be used in semiconductor fabrication operations to transfer a predetermined pattern onto a substrate. For example, after forming a photoresist layer over a substrate, the photoresist layer can be exposed to an actinic radiation through a mask, thus a photoresist pattern can be formed by subsequent developing.

Baking operations can be performed in conjunction with resist coating, exposing, and developing. Particles may be generated during baking operation, wherein particles may cause defect of fabricated devices. In order to alleviate the issues caused by particles, an improved exhaust system for removing generated particles is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
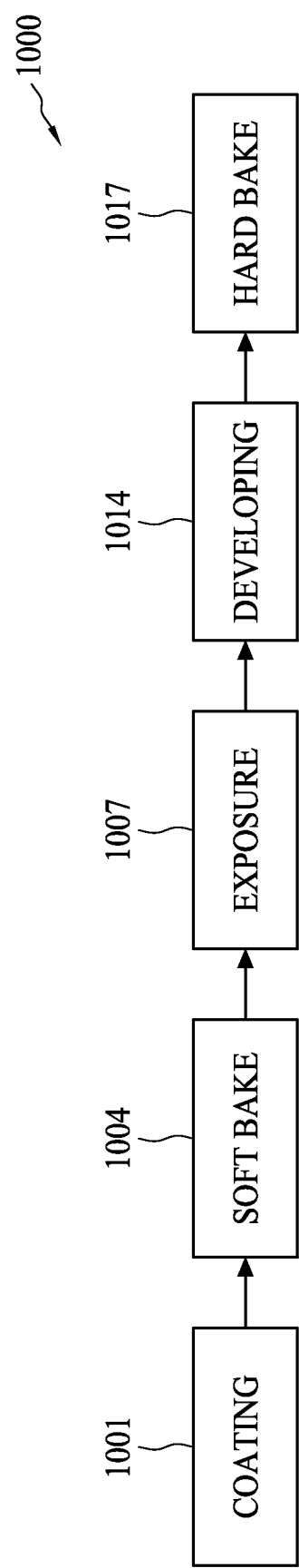
FIG. 1A shows a flow chart representing method for fabricating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to FIG. 1A, FIG. 1A shows a flow chart representing method for fabricating a semiconductor device, in accordance with some embodiments of the present disclosure. The method 1000 for fabricating a semiconductor device includes applying a photoresist layer on a wafer (operation 1001, which can be performed in a coater), preforming a soft bake operation on the wafer (operation 1004), exposing the photoresist layer with actinic radiation using an optical lithography tool (operation 1007), developing the photoresist layer (operation 1014), and preforming a hard bake operation on the wafer (operation 1017). In some embodiments, the method 1000 may optionally include applying Hexamethyldisilazane (HMDS) on the wafer prior to applying the photoresist layer on the wafer in order to improve the adhesion between photoresist and the top surface of the wafer. In some embodiments, hard baking operation includes heating the wafer to harden the photoresist layer.

In some embodiments, in order to improve the performance of subsequence lithography operations, soft baking operation, includes heating the wafer to reduce residual solvent concentration, can be performed. During performing the soft bake operation, or other similar operation including heating the wafer to transform a material into gaseous state, thereby the solvent in gaseous state will be exhausted through an exhaust member. However, it is observed that an air flow from over the surface of the wafer toward the exhaust member may be unstable and thereby causing turbulence. Such turbulence may weaken the efficiency of the exhaustion, and further causes a temperature drop to the air flow. In some cases, the solvent may condensed before exhausted due to the temperature drop of air flow, for example, solvent usually used in the photoresist may not remain in gaseous state when a temperature of the air flow decreased to below 154° C. Such solvent may condensed on the wafer or the photoresist layer formed on the wafer in the soft baking chamber, causing particle contamination. The particle contaminations can deteriorate the performance of devices fabricated thereafter.

It should be noted that in some cases, a portion of the solvent may transform from gaseous phase to liquid phase before solidified, and a portion of the solvent may directly transform from gaseous phase to solid phase, depending on the temperature and pressure (e.g., which can be referred to the three phase diagram of the solvent) at the junction of the exhaust member and the soft baking chamber.

In order to reduce the particle contamination before the solvent being exhausted, the present disclosure provides an apparatus for fabricating a semiconductor structure and method for fabricating a semiconductor device for alleviating the instability of exhaust air flow and help preventing a temperature of the air flow from decreasing to below a certain threshold value.

Figure 1B:
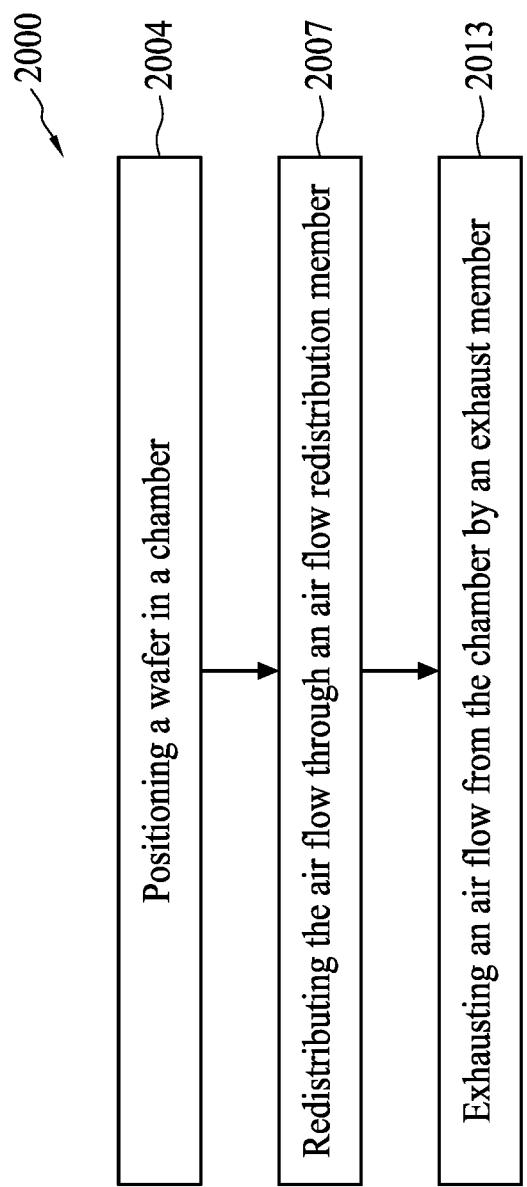
FIG. 1B shows a flow chart representing method for fabricating a semiconductor device, in accordance with some embodiments of the present disclosure.

Referring to FIG. 1B, FIG. 1B shows a flow chart representing method for fabricating a semiconductor device, in accordance with some embodiments of the present disclosure. The method 2000 for fabricating a semiconductor device includes positioning a wafer in a chamber (operation 2004, which can be referred to FIG. 2B), redistributing the air flow through an air flow redistribution member (operation 2007, which can be referred to FIG. 2B to FIG. 4C), and exhausting an air flow from the chamber by an exhaust member (operation 2013, which can be referred to FIG. 2A, FIG. 3, and/or FIG. 5).

Figure 1C:
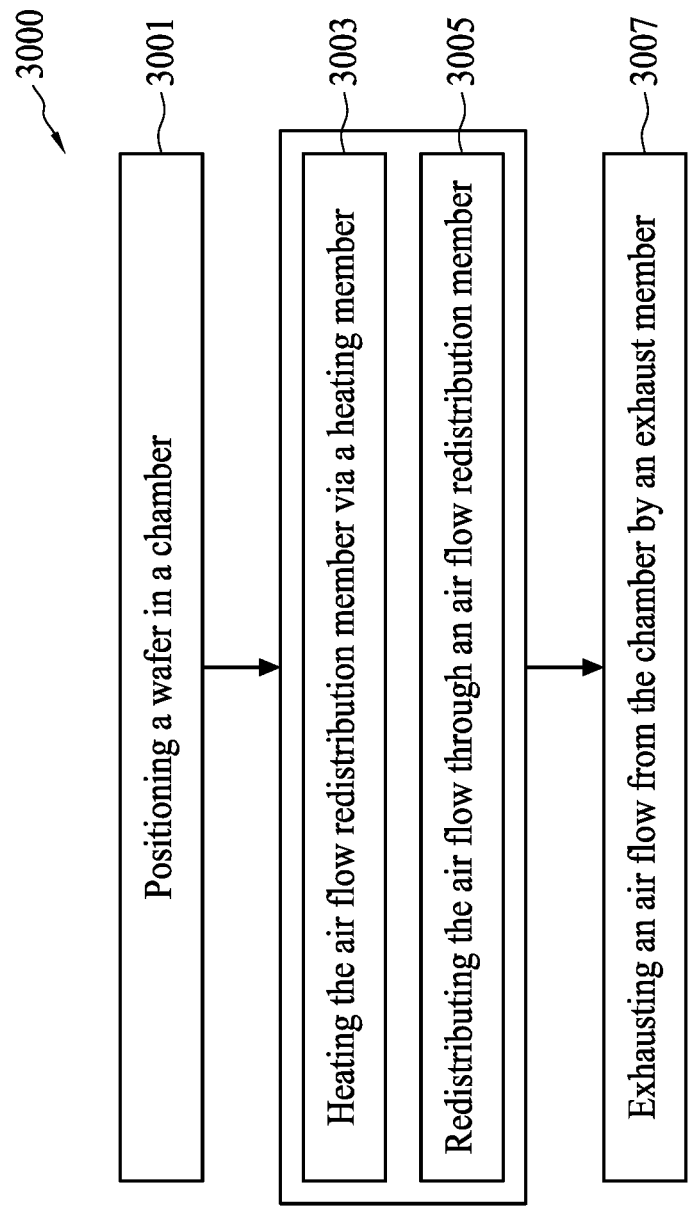
FIG. 1C shows a flow chart representing method for fabricating a semiconductor device, in accordance with some embodiments of the present disclosure.

Referring to FIG. 1C, FIG. 1C shows a flow chart representing method for fabricating a semiconductor device, in accordance with some embodiments of the present disclosure. The method 3000 for fabricating a semiconductor device includes positioning a wafer in a chamber (operation 3001, which can be referred to FIG. 2B), heating the air flow redistribution member via a heating member (operation 3003, which can be referred to FIG. 5), redistributing the air flow through an air flow redistribution member (operation 3005, which can be referred to FIG. 2B to FIG. 4C), and exhausting an air flow from the chamber by an exhaust member (operation 3007, which can be referred to FIG. 2A, FIG. 3, and/or FIG. 5).

Figure 1D:
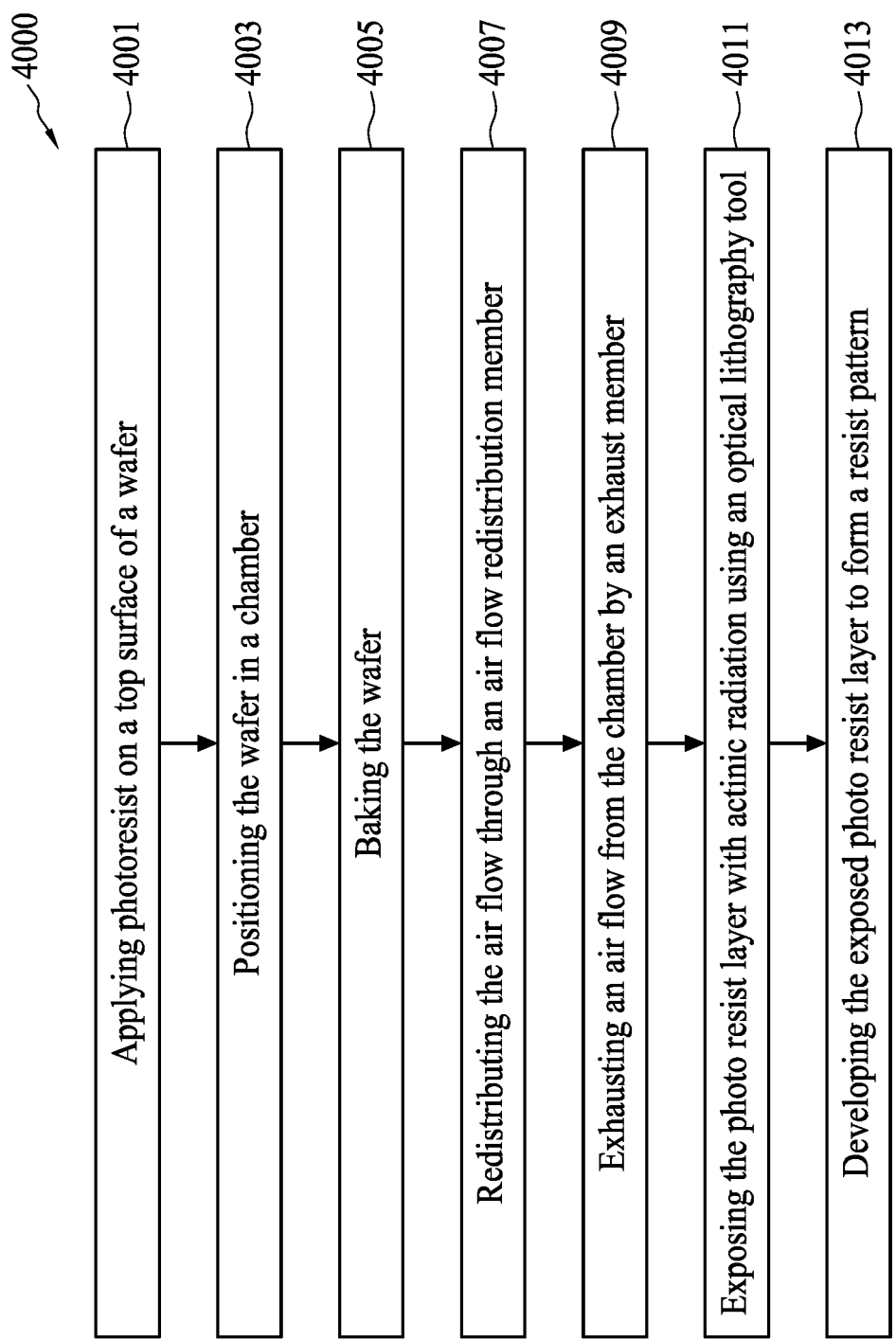
FIG. 1D shows a flow chart representing method for fabricating a semiconductor device, in accordance with some embodiments of the present disclosure.

Referring to FIG. 1D, FIG. 1D shows a flow chart representing method for fabricating a semiconductor device, in accordance with some embodiments of the present disclosure. The method 4000 for fabricating a semiconductor device includes applying photoresist on a top surface of a wafer (operation 4001, which can be referred to FIG. 1A), positioning a wafer in a chamber (operation 4003, which can be referred to FIG. 2B), baking the wafer (operation 4005, which can be referred to FIG. 1A and FIG. 2B), redistributing the air flow through an air flow redistribution member (operation 4007, which can be referred to FIG. 2B to FIG. 4C), and exhausting an air flow from the chamber by an exhaust member (operation 4009, which can be referred to FIG. 2A, FIG. 3, and/or FIG. 5), exposing the photo resist layer with actinic radiation using an optical lithography tool (operation 4011, which can be referred to FIG. 1A), and developing the exposed photo resist layer to form a resist pattern (operation 4013, which can be referred to FIG. 1A).

Figure 2A:
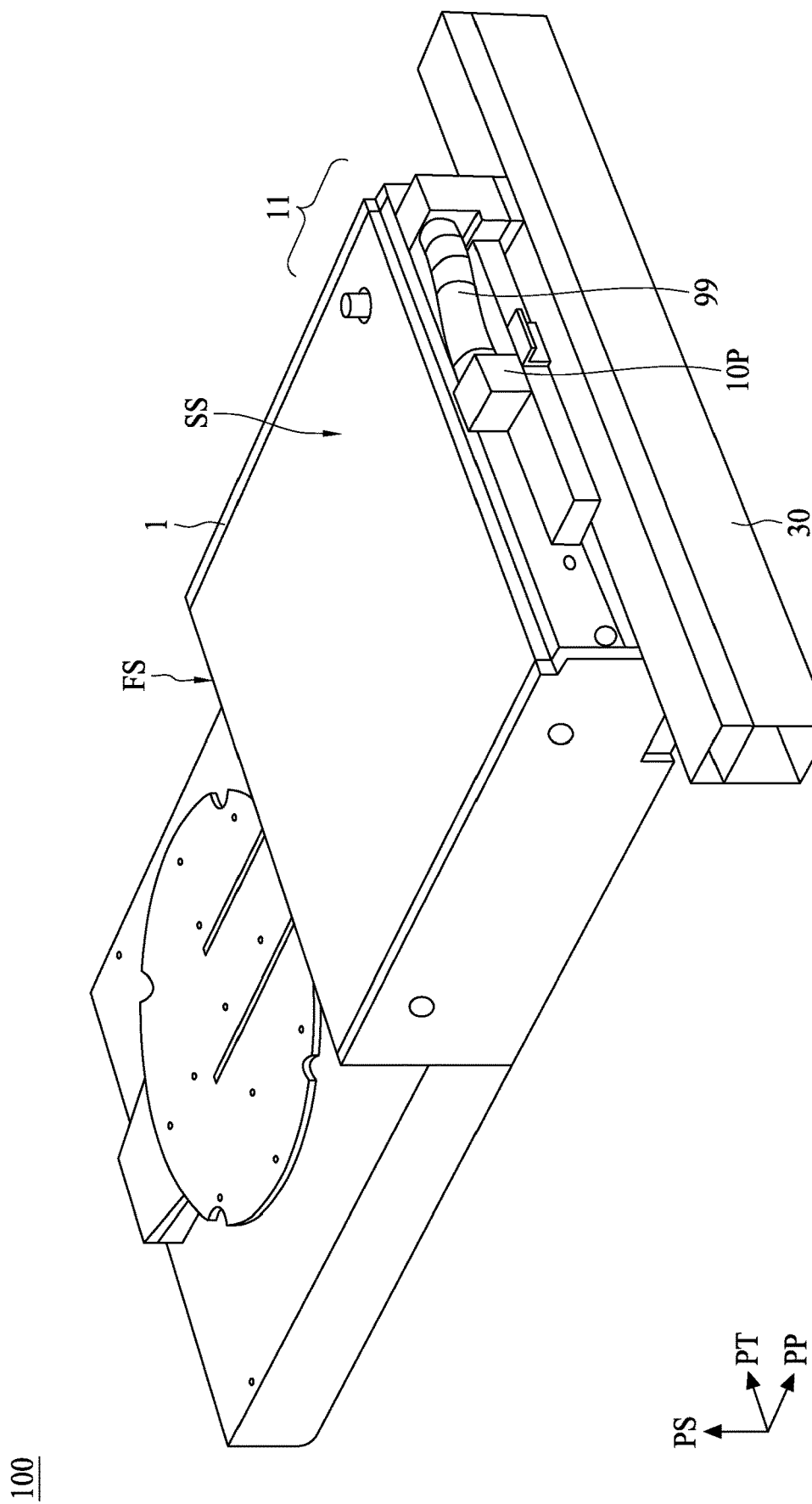
FIG. 2A is a perspective view of an apparatus for fabricating a semiconductor device, in accordance with some embodiments of the present disclosure.
Figure 2B:
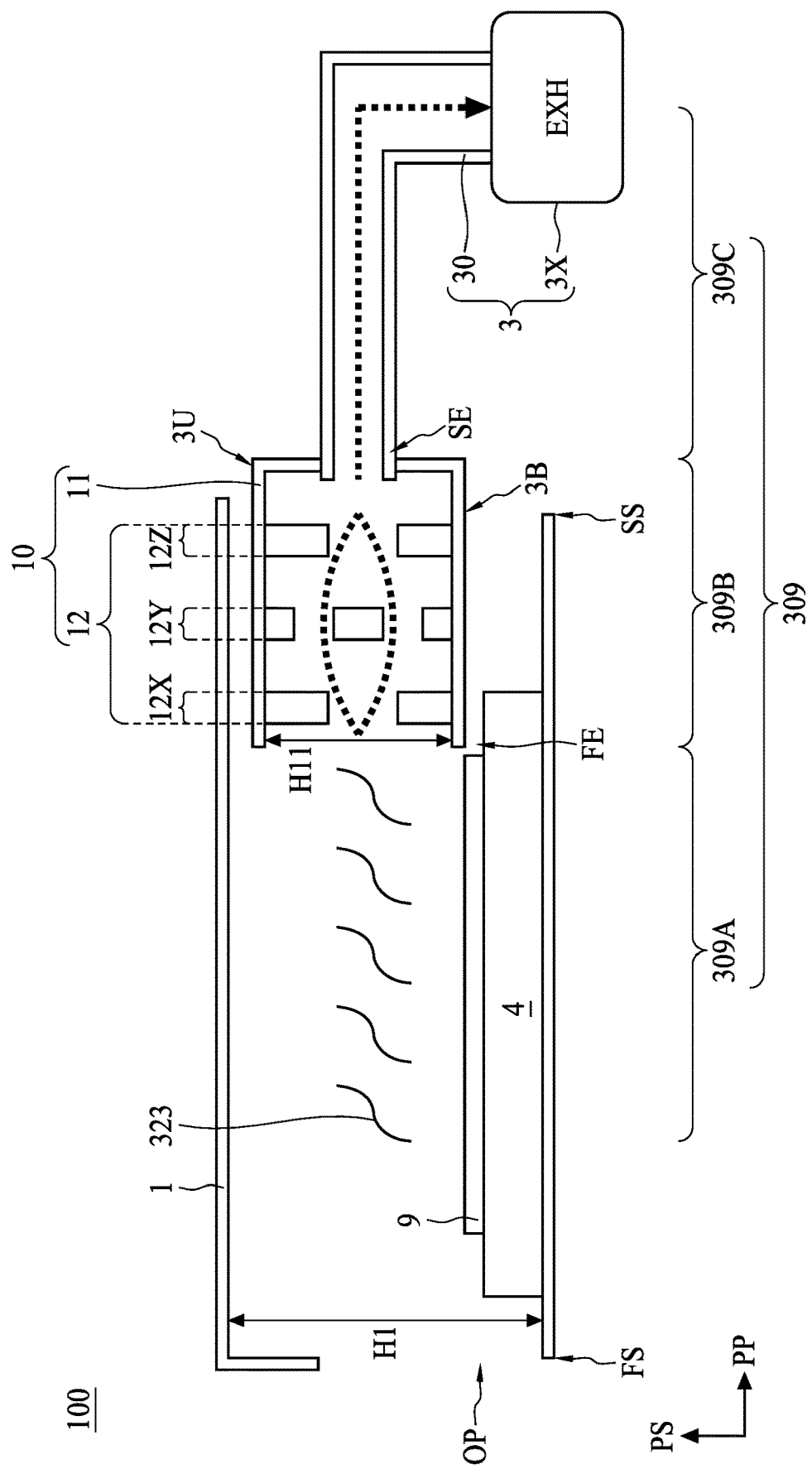
FIG. 2B is a cross sectional view of an apparatus for fabricating a semiconductor device, according to some embodiments of the present disclosure.

Referring to FIG. 2A and FIG. 2B, FIG. 2A is a perspective view of an apparatus for fabricating a semiconductor device, FIG. 2B is a cross sectional view of an apparatus for fabricating a semiconductor device, in accordance with some embodiments of the present disclosure. The apparatus 100 at least includes a chamber 1 for performing heat treatment (such as soft bake) on a wafer 9, and an exhaust member 3 connected to the chamber 1. A hot plate 4 is disposed in the chamber 1 and configured to support and heat the wafer 9. The hot plate 4 is proximal to a bottom surface of the chamber 1. Under an elevated temperature, chemical 323 (such as solvent) is transformed into gaseous state in the chamber 1. The exhaust member 3 may include an exhaust pump 3X configured to provide a pressure lower than an operation pressure in the chamber 1 (such as vacuum, lower pressure, or negative pressure) to exhaust the air in the chamber 1, thereby exhaust the chemical 323 away from the chamber along with an air flow 309. Herein the air flow 309 to be exhausted by the exhaust pump 3X can be transferred through an exhaust pipe 30 of the exhaust chamber 3, wherein the exhaust pipe 30 is between the chamber 1 and the exhaust pump 3X. In some embodiments, the wafer 9 can be transferred into (or from) the chamber 1 from an opening OP at a first side FS of the chamber 1, and the exhaust pipe 30 is disposed at a second side SS different from the first side FS. For one of the example, the second side SS is at an opposite side of the first side FS. However, the relationship between the first side FS and the second side SS may be adjusted according to the configuration of the chamber 1.

Furthermore, in order to alleviate unstable turbulence of the air flow 309, an air flow redistribution member 10 is disposed at a position between the hot plate 4 and the exhaust member 3. It is observed that by redistributing the air flow 309, the stability of air flow 309 can be improved, and turbulence can be alleviated. In some embodiments, the air flow redistribution member 10 includes a secondary cover 11 between the exhaust pipe 30 and the hot plate 4, wherein the secondary cover 11 extends from the exhaust pipe 30 to under a top surface of the chamber 1. The secondary cover 11 may be partially surrounded by the chamber 1. The hot plate 4 is proximate to a bottom surface of the air flow redistribution member 10 (or the secondary cover 11). A height 1111 of the secondary cover 11 (measured from an inner bottom surface to an inner top surface) may optionally be less than a height H1 of the chamber 1 (measured from an inner bottom surface to an inner top surface). In some embodiments, a portion of the secondary cover 11 is exposed from the chamber 1. In some embodiments, the exhaust pipe 30 is connected to an exposed sidewall of the secondary cover 11, and may optionally be proximal to a center of the sidewall. In some embodiments, the secondary cover 11 further includes an exit port 10P for guiding air flow to outside of the chamber 1. Optionally, the exit port 10P and the exhaust pipe 30 are connected by a pipe 99. The air flow 309 along with the generated chemical 323 from the chamber 1 is redistributed by the air flow redistribution member 10 between the hot plate 4 and the exhaust member 3, and subsequently transferred to the exhaust pipe 3. The air flow redistribution member 10 is configured to receive the air flow 309 at a first end FE proximal to the hot plate 4 and eject the air flow 309 at a second end SE distal to the hot plate 4. Alternatively stated, the air flow redistribution member 10 is at an upper stream of the air flow 309, and the exhaust member 3 is at a lower stream of the air flow 309. The details of the air flow redistribution member 10 will be discussed subsequently in FIG. 3 and FIG. 4A to FIG. 4C.

Figure 3:
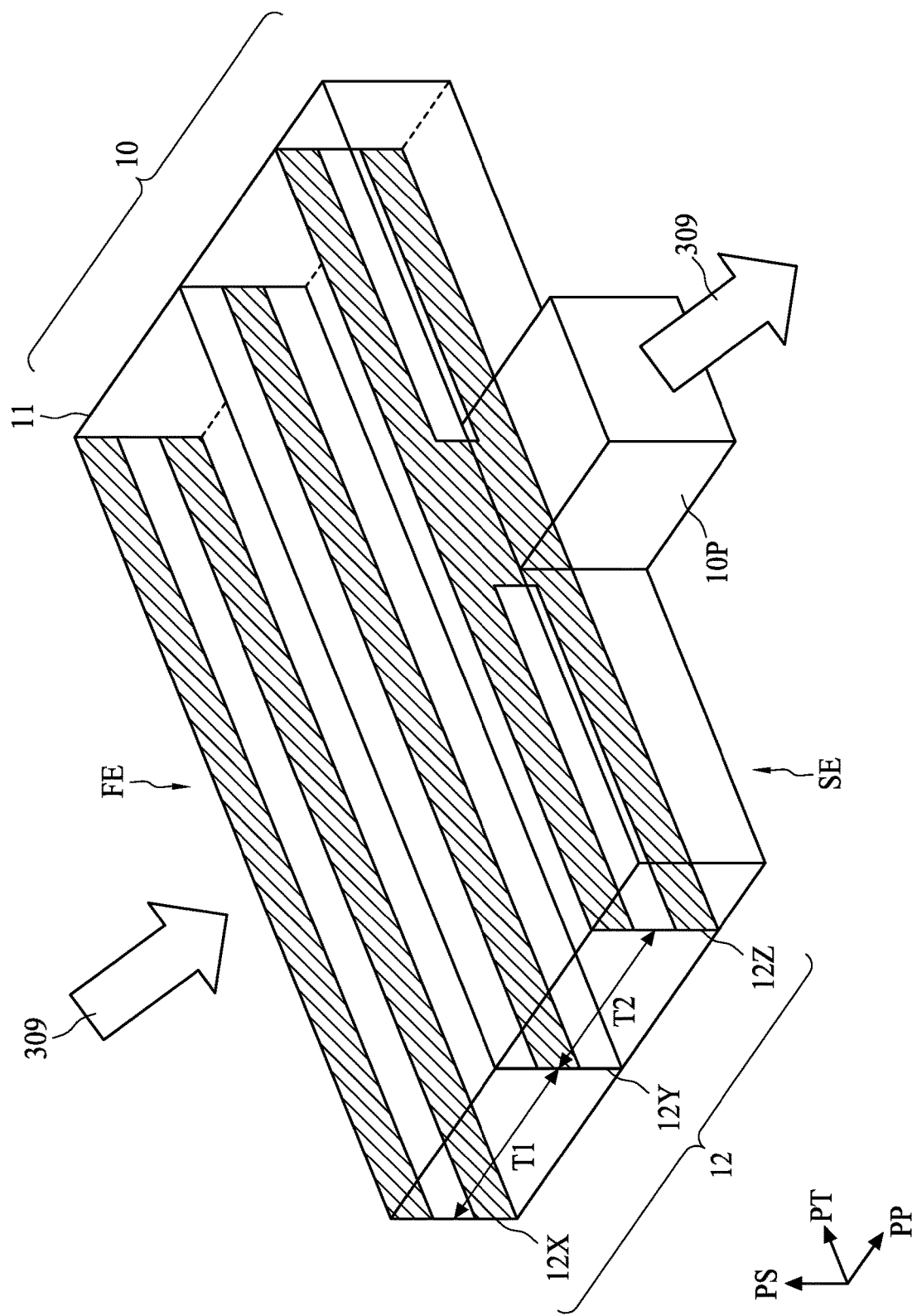
FIG. 3 is a perspective view of an air flow redistribution member of an apparatus for fabricating a semiconductor device, in accordance with some embodiments of the present disclosure.

Referring to FIG. 2B and FIG. 3, FIG. 3 is a perspective view of an air flow redistribution member of an apparatus for fabricating a semiconductor device, in accordance with some embodiments of the present disclosure. The air flow redistribution member 10 further includes a plurality of air flow redistribution plates 12 disposed in the secondary cover 11. For example as provided in FIG. 3, the air flow redistribution member 10 includes a first air flow redistribution plate 12X (proximal to the first end FE of the air flow redistribution member 10), a second air flow redistribution plate 12Y, and a third air flow redistribution plate 12Z. The secondary cover 11 extends along a primary direction PP, thereby guiding the air flow 309 to flow toward the primary direction PP. The second air flow redistribution plate 12Y is disposed separately from the first air flow redistribution plate 12X along the primary direction PP, and the third air flow redistribution plate 12Z is disposed separately from the second air flow redistribution plate 12Y along the primary direction PP (which is closer to the second end SE comparing to the first air flow redistribution plate 12X). Alternatively stated, comparing to the first air flow redistribution plate 12X, the second air flow redistribution plate 12Y is at a lower stream of the air flow 309; and comparing to the second air flow redistribution plate 12Y, the third air flow redistribution plate 12Z is at a lower stream of the air flow 309. In some embodiments, a material of the air flow redistribution plates 12 is selected from materials that can endure elevated temperature (e.g. negligible deformation when heated) and does not have apparent chemical reaction with the chemical 323 in gaseous state. For example, the material of the air flow redistribution plates 12 can be stainless steel, or the like. However, the present disclosure is not limited thereto.

Alternatively, the air flow redistribution member 10 can include different number of air flow redistribution plates 12. Any numbers of air flow redistribution plates 12 incorporated into the air flow redistribution member 10 are within the scope of the present disclosure, as long as the air flow redistribution member 10 can redistribute the air flow 309. In some embodiments, more than three air flow redistribution plates can be disposed in the air flow redistribution member 10.

Figure 4A:
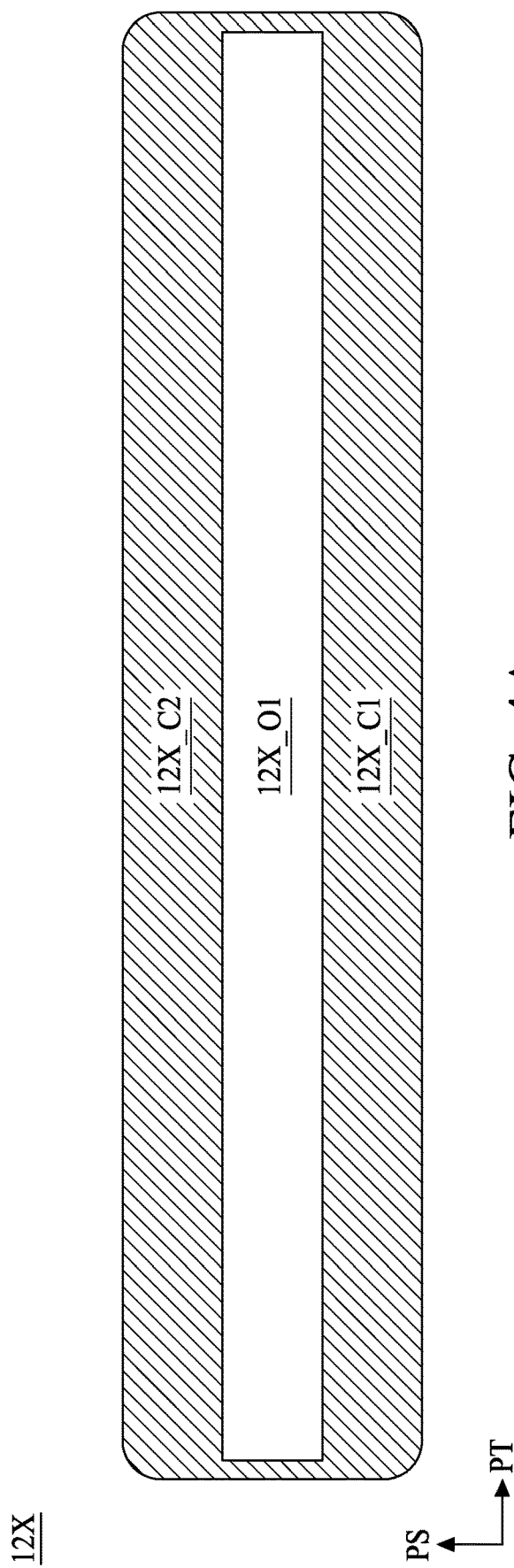
FIG. 4A is a front perspective view of an air flow redistribution plate of an apparatus for fabricating a semiconductor device, in accordance with some embodiments of the present disclosure.
Figure 4B:
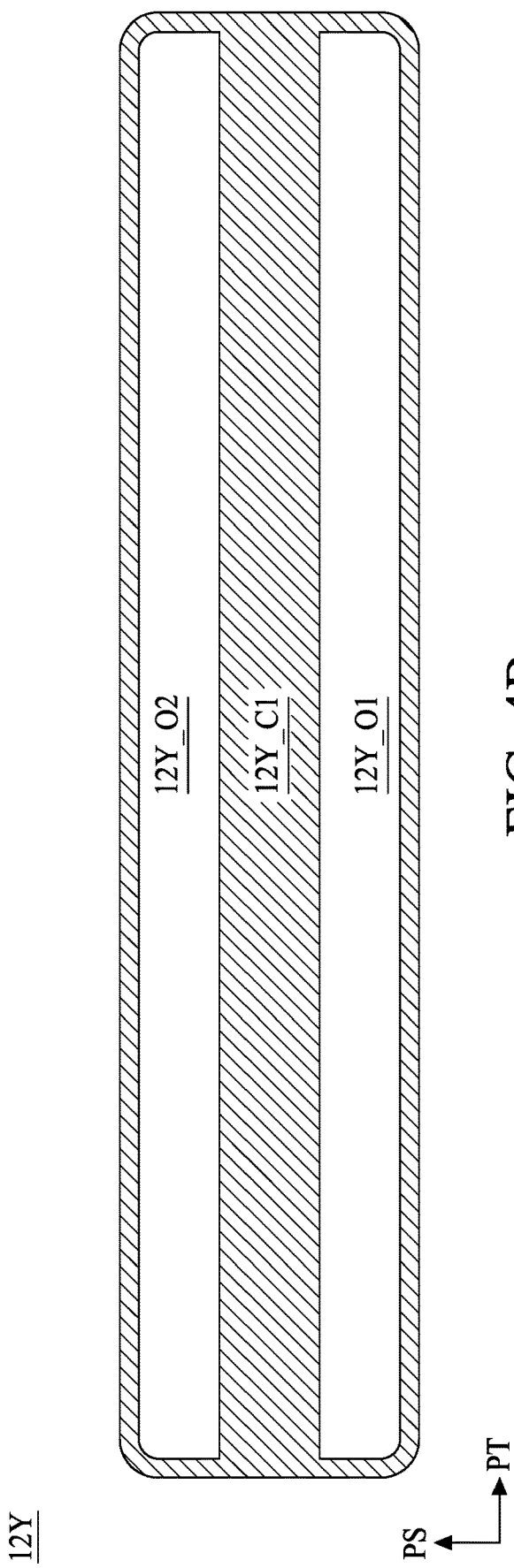
FIG. 4B is a front perspective view of an air flow redistribution plate of an apparatus for fabricating a semiconductor device, in accordance with some embodiments of the present disclosure.
Figure 4C:
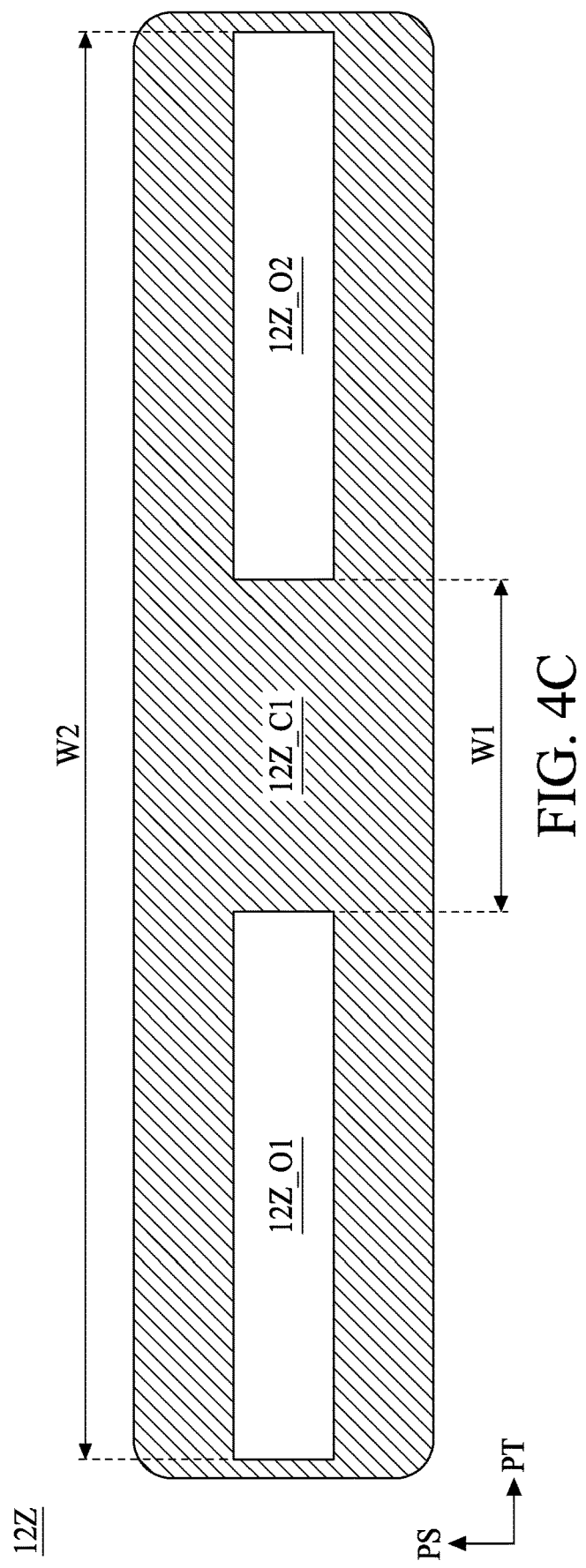
FIG. 4C is a front perspective view of an air flow redistribution plate of an apparatus for fabricating a semiconductor device, in accordance with some embodiments of the present disclosure.

Referring to FIG. 3, FIG. 4A, FIG. 4B, and FIG. 4C, FIG. 4A is a front perspective view of an air flow redistribution plate of an apparatus for fabricating a semiconductor device, FIG. 4B is a front perspective view of an air flow redistribution plate of an apparatus for fabricating a semiconductor device, FIG. 4C is a front perspective view of an air flow redistribution plate of an apparatus for fabricating a semiconductor device, in accordance with some embodiments of the present disclosure. Examples of the first air flow redistribution plate 12X, the second air flow redistribution plate 12Y, and the third air flow redistribution plate 12Z are shown in FIG. 4A, FIG. 4B, and FIG. 4C respectively. Under the condition where three air flow redistribution plates 12 are implemented, following arrangement shows optimal air flow redistribution result. A distance T1 is between the first air flow redistribution plate 12X and the second air flow redistribution plate 12Y, a distance T2 is between the second air flow redistribution plate 12Y and the third air flow redistribution plate 12Z. The distance T1 is in a range from about 10 mm to about 40 mm, and a ratio of T1/T2 is in a range from about 0.8 to 1.1. Each of the first air flow redistribution plate 12X, the second air flow redistribution plate 12Y, and the third air flow redistribution plate 12Z has closed area and opening area, wherein the opening area allows air flow 309 to flow through, while closed area blocks the air flow 309 from directly going through. In some embodiments, the second air flow redistribution plate 12Y is different from the first air flow redistribution plate 12X, and the third air flow redistribution plate 12Z is different from the second air flow redistribution plate 12Y. The third air flow redistribution plate 12Z may also be different from the first air flow redistribution plate 12X. In some of the embodiments, an opening area of the first air flow redistribution plate 12X corresponds to a closed area of the second air flow redistribution plate 12Y. Thereby, the air flow 309 can be redistributed effectively, and turbulence may be alleviated.

An example of the first air flow redistribution plate 12X is shown in FIG. 4A. The first air flow redistribution plate 12X includes a first closed area 12X_C1, a first opening area 12X_O1 above the first closed area 12X_C1, and a second closed area 12X_C2 above the first opening area 12X_O1. In some of the embodiments, the first opening area 12X_O1 extends along a tertiary direction PT, which is perpendicular to the primary direction PP. By allowing the air flow 309 to flow through the first opening area 12X_O1 and blocking the air flow 309 by the first closed area 12X_C1 and the second closed area 12X_C2, the cross section area allowing the air flow 309 to flow through may be decreased, thereby stabilize the air flow 309 and alleviate turbulence. In some embodiments, in order to effectively stabilize the air flow 309, a total area of the first opening area 12X_O1 is less than half of the total area of closed area, that is, 50% of total area of the first closed area 12X_C1 and the second closed area 12X_C2. In some of the embodiments, a total area of the first opening area 12X_O1 is identical with each of the first closed area 12X_C1 and the second closed area 12X_C2, but the present disclosure is not limited thereto. Alternatively stated, a total area of the first opening area 12X_O1 is less than one third of the total area of the total area of the first air flow redistribution plate 12X. It is observed that by having a total area of the opening area less than half of the total area of closed area, the air flow 309 may be effectively stabilized. In some alternative embodiments, the first opening area 12X_O1 may include a plurality of apertures. In some of the embodiments, the apertures may be aligned, for example, along with the tertiary direction PT.

An example of the second air flow redistribution plate 12Y is shown in FIG. 4B. The second air flow redistribution plate 12Y include a first closed area 12Y_C1, a first opening area 12Y_O1 below the first closed area 12Y_C1, and a second opening area 12Y_O2 above the first closed area 12Y_C1. Alternatively stated, the opening area of the has an upper opening (the second opening area 12Y_O2) and a lower opening (the first opening area 12Y_O1) disposed separately along with a secondary direction PS perpendicular to the primary direction PP and the tertiary direction PT. In some of the embodiments, the first opening area 12X_O1 of the first air flow redistribution plate 12X corresponds to the first closed area 12Y_C1 of the second air flow redistribution plate 12Y. In some of the embodiments, the first closed area 12X_C1 and the second closed area 12X_C2 of the first air flow redistribution plate 12X respectively correspond to the first opening area 12Y_O1 and the second opening area 12Y_O2 of the second air flow redistribution plate 12Y. In some alternative embodiments, the opening areas of the second air flow redistribution plate 12Y may include a plurality of apertures. In some of the embodiments, the apertures may be aligned, for example, along with the tertiary direction PT. Specifically, by having separate opening disposed along the secondary direction PS, the second air flow redistribution plate 12Y can be used as a rectifier to rectify the air flow 309 due to redistribution along a different direction, wherein the air flow 309 may be separated and guided to flow through the separate opening. By such configuration, the air flow 309 can be rectified and stabilized.

An example of the third air flow redistribution plate 12Z is shown in FIG. 4C. The third air flow redistribution plate 12Z includes a first closed area 12Z_C1, a first opening area 12Z_O1, and a second opening area 12Z_O2, wherein the first opening area 12Z_O1 and the second opening area 12Z_O2 are disposed separately along the tertiary direction PT perpendicular to the primary direction PP and the secondary direction PS. At least a portion of the first closed area 12Z_C1 is spacing between the first opening area 12Z_O1 and the second opening area 12Z_O2. Alternatively stated, the third air flow redistribution plate 12Z includes a left opening (the first opening area 12Z_O1) and a right opening (the second opening area 12Z_O2). In some embodiments, the first opening area 12Z_O1 and the second opening area 12Z_O2 of the third air flow redistribution plate 12Z corresponds to the first closed area 12Y_C1 of the second air flow redistribution plate 12Y. In some of the embodiments, the first opening area 12Y_O1 and the second opening area 12Y_O2 of the second air flow redistribution plate 12Y correspond to the first closed area 12Z_C1 of the third air flow redistribution plate 12Z. Herein the third air flow redistribution plate 12Z can be used as a splitter to further split the air flow 309 in a direction different from the separating direction at the second air flow redistribution plate 12Y, thereby further improving the stability of the air flow 309 and alleviate turbulence. In some embodiments, the first closed area 12Z_C1 has a first width W1 and the third air flow redistribution plate 12Z has a second width (or alternatively W2 can be measured between two opposite edges of the first opening area 12Z_O1 and the second opening area 12Z_O2), wherein a ratio of W1/W2 is in a range from about 0.2 to about 0.6, so as to achieve optimal performance of air flow 309 splitting and redistribution. In some alternative embodiments, the opening areas of the third air flow redistribution plate 12Z may include a plurality of apertures. In some of the embodiments, the apertures may be aligned, for example, along with the tertiary direction PT.

It is observed that by redistributing the air flow 309, the stability of air flow 309 can be improved, and turbulence can be alleviated. By having an opening configured on an air flow redistribution plate 12 at an upper stream of the air flow 309 correspond to a closed area of the next air flow redistribution plate 12 at a lower stream of the air flow 309 (that is, the opening area of the two adjacent air flow redistribution plates 12 are not aligned), the redistribution of the air flow 309 can be enhanced. Furthermore, by guiding the air flow 309 to separate at an air flow redistribution plate 12 at an upper stream of the air flow 309 in a direction (such as in the secondary direction PS), and separate at the next air flow redistribution plate 12 at a lower stream of the air flow 309 in another direction (such as in the tertiary direction PT), the redistribution of the air flow 309 can further be enhanced.

In a comparative embodiment of not having an air flow redistribution member 10 between the hot plate 4 and the exhaust member 3, a portion of the air flow may flow in a reverse direction along the primary direction PP due to the non-uniformity of local flow velocity across a given cross section. Specifically, a local flow velocity of air flow near an inner wall of the chamber 1 (or a secondary cover partially surrounded by the chamber) is different from the local flow velocity in the middle of the same given cross section, wherein greater extent of turbulence may more likely be induced. Therefore, by guiding the air flow 309 through openings disposed in different position, or separating the air flow 309 in different direction at different position (with regard to primary direction PP), the turbulence can be alleviated. The air flow redistribution plates 12 may further help preventing solidified or condensed particles of chemical 323 in the air flow redistribution member 10 to flow back to the chamber 1 due to the reduction of the opening area at the first air flow redistribution plate 12X.

It should be noted the shape(s) of the opening area in any aforesaid air flow redistribution plate 12 may include be square, rectangular, round, curved, or having regular shape, irregular shape, or the like.

Figure 5:
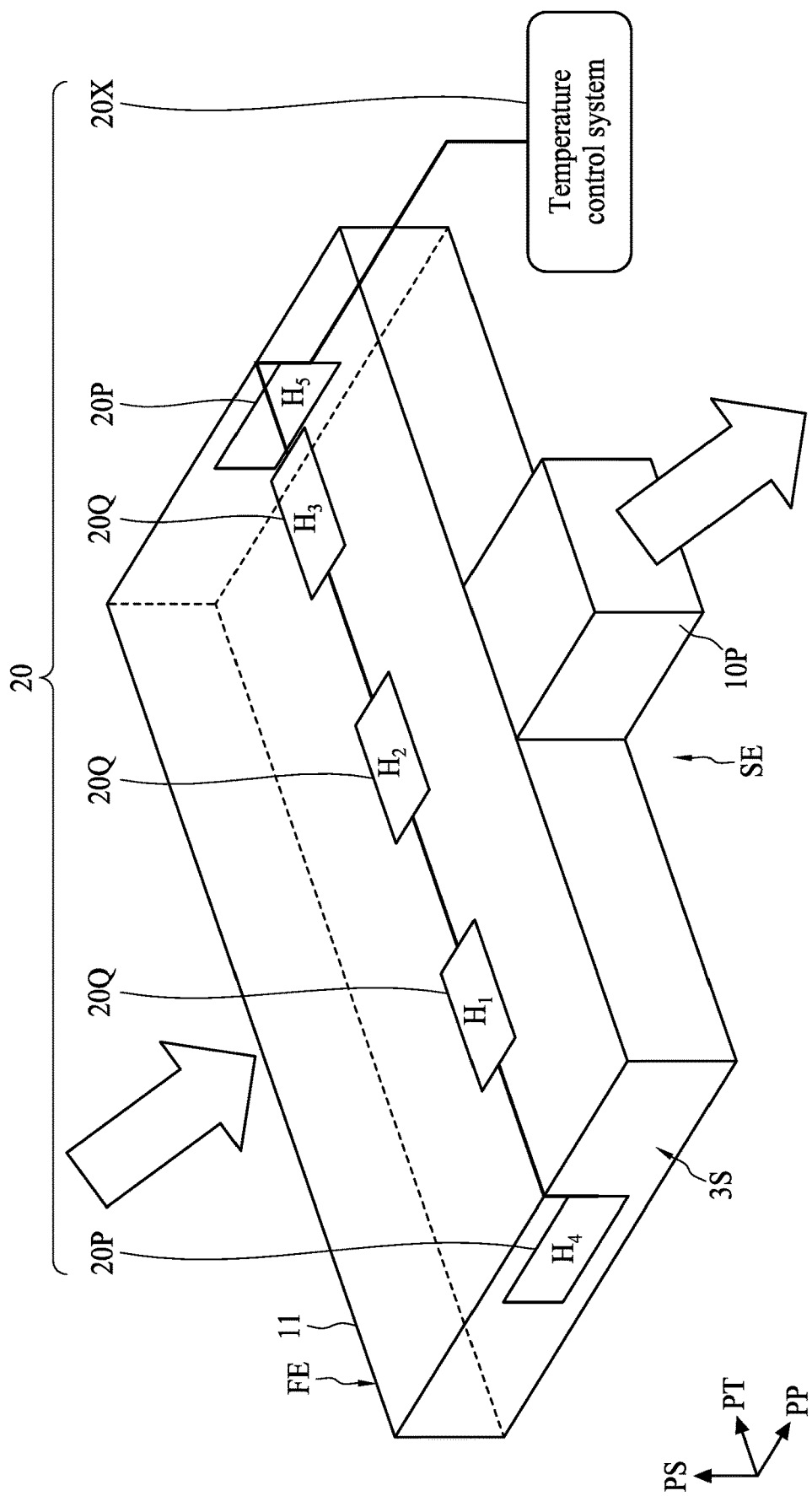
FIG. 5 is a perspective view of an air flow redistribution member of an apparatus for fabricating a semiconductor device, in accordance with some embodiments of the present disclosure.

Referring to FIG. 2B and FIG. 5, FIG. 5 is a perspective view of an air flow redistribution member of an apparatus for fabricating a semiconductor device, in accordance with some embodiments of the present disclosure. It is observed that a temperature of the air flow 309 in the chamber 1 (hereinafter denoted as air flow 309A) is greater than a temperature of the air flow 309 in the exhaust member 3 (hereinafter denoted as air flow 309C) since the temperature of the air flow 309 in the chamber 1 is closer to the hot plate 4. As previously discussed in FIG. 1A, it is observed that temperature drop of the air flow 309 is one of the factors of causing the generation of condensed or solidified particles of chemical 323. Therefore, besides redistributing the air flow 309 as discussed in FIG. 2A to FIG. 4C, further elevating a temperature of the air flow 309 at a position between the hot plate 4 and the exhaust member 3 (hereinafter demoted as air flow 309B) can alleviate the solidification or condensation of chemical 323.

In some embodiments, by disposing a heating member 20 at a surface of the air flow redistribution member 10, a temperature of the air flow 309B between the hot plate 4 and the exhaust member 3 can be elevated, thereby a difference between the temperature of the air flow 309A in the chamber 1 and the temperature of the air flow 309C in the exhaust member 3 can be decreased. In some embodiments, the temperature of the air flow 309B between the hot plate 4 and the exhaust member 3 is elevated to be in a range from about 90% of the temperature of the air flow 309A in the chamber 1 (in degree Celsius) to about 110% of the temperature of the air flow 309A in the chamber 1 (in degree Celsius). In some embodiments, a temperature of the air flow 309B between the hot plate 4 and the exhaust member 3 is heated to be above a melting point of the chemical 323 and/or above 90% of the temperature of the air flow 309A, thereby the chemical 323 can remain in gaseous state until entering into the exhaust member 3.

In a comparative embodiment of not incorporating the heating member 20 at a surface of the air flow redistribution member 10, it is observed that a temperature of the air flow 309B at a surface of the air flow redistribution member 10 distal to the hot plate 4 is lower than a temperature of the air flow 309B at another surface of the air flow redistribution member 10 proximal to the hot plate 4. In the example of having a hot plate 4 proximal to a bottom surface 3B of the secondary cover 11 of the air flow redistribution member 10, the heating member 20 can be disposed at an upper surface 3U of the secondary cover 11 of the air flow redistribution member 10 (such heating member 20 are denoted as 20Q in FIG. 5) to further improve the uniformity of temperature distribution. Alternatively in some embodiments, the heating member 20 can be disposed at a sidewall 3S of the secondary cover 11 (such heating member 20 are denoted as 20P in FIG. 5). Alternatively, the heating member 20 can further be disposed at a bottom surface 3B of the secondary cover 11.

Referring to FIG. 2B, FIG. 3 and FIG. 5, in some embodiments, in order to further enhance the temperature uniformity of the air flow 309B, one or more heating member 20Q is disposed between the second air flow redistribution plate 12Y and the third air flow redistribution plate 12Z (from a top view perspective). Optionally, such heating member(s) 20Q is closer to the second air flow redistribution plate 12Y than the third air flow redistribution plate 12Z. Such configuration may further improve the temperature uniformity of the air flow 309B.

In some embodiments, the heating member 20 may be a heating coil, which can be controlled by a temperature control system 20X connected thereto. Optionally, the heating member 20 can be disposed at an inner surface of the secondary cover 11, or alternatively, disposed at an outer surface of the secondary cover 11. It should be noted that the heating member 20 can also be substituted by any other suitable heating source. It should be noted that the aforesaid temperature control system 20X can be implemented by software such that the methods disclosed herein can be performed automatically or semi-automatically. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions can be received from a remote storage device, such as a server on a network. The present invention can also be implemented in hardware systems, microcontroller unit (MCU) modules, discrete hardware or firmware.

Referring back to FIG. 1A and FIG. 2B, after performing the soft bake operation on the wafer 9, the wafer 9 can be removed from the hot plate 4 of the chamber 1 through the opening OP of the chamber 1, and further transferred by an arm to an optical lithography tool to expose the photoresist layer from on the wafer 9 with actinic radiation. The wafer 9 may further be developed and subjected to a hard bake operation. The present disclosure is applicable to various types of lithography operation from fabricating various type of devices across various generations (such as N65, N40, N28, N22, N16, N10, N7, N5, or the like), including but not limited to, liquid crystal display (LCD), integrated circuits, memory device (such as MRAM, DRAM, or the like), semiconductor fin structure, any other semiconductor devices, or the like.

In order to reduce solidified or condensed chemical (such as solvent) before being exhausted and improve the efficiency of exhaustion, the present disclosure provides an apparatus for fabricating a semiconductor structure and method for fabricating a semiconductor device for enhancing the stability of exhaust air flow and preventing a temperature of the air flow from decreasing to below a certain threshold value. By incorporating the air flow redistribution member 10, the uniformity of the air flow 309 can be improved, and turbulence can be alleviated. Specifically, by guiding the air flow 309 through openings disposed in different position on a plurality of the air flow redistribution plates 12, or separating the air flow 309 in different direction at different position, the turbulence can be alleviated. The air flow redistribution plates 12 may help preventing solidified or condensed particles of chemical 323 in the air flow redistribution member 10 to re-enter the chamber 1. Furthermore, by incorporating the heating member 20, a temperature of the air flow 309 between the hot plate 4 and the exhaust member 3 can be elevated, thereby hindering the chemical 323 from being solidified or condensed before being exhausted.

Some embodiments of the present disclosure provide an apparatus for fabricating a semiconductor structure, including an air flow redistribution member configured to receive an air flow at a first end and eject the air flow at a second end, wherein the air flow redistribution member includes a first air flow redistribution plate and a second air flow redistribution plate between the first air flow redistribution plate and the second end.

Some embodiments of the present disclosure provide an apparatus for fabricating a semiconductor structure, including a chamber, an exhaust member connected to the chamber, an air flow redistribution member connected to the exhaust member, and a heating member disposed at a surface of the air flow redistribution member.

Some embodiments of the present disclosure provide a method for fabricating a semiconductor structure, including positioning a wafer in a chamber, exhausting an air flow from the chamber by an exhaust member, and redistributing the air flow through an air flow redistribution member prior to exhausting the air flow by the exhaust member.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus for fabricating a semiconductor structure, comprising:
    a chamber, comprising a top surface;
    an exhaust member connected to the chamber;
    an air flow redistribution member connected to the exhaust member, comprising:
        a first air flow redistribution plate, wherein a portion of the first air flow redistribution plate is under a coverage of a vertical projection area of the top surface of the chamber; and
        a second air flow redistribution plate between the first air flow redistribution plate and the exhaust member; and
    a heating member disposed at a surface of the air flow redistribution member.

2. The apparatus of claim 1, further comprising a hot plate in the chamber and proximal to a bottom surface of the air flow redistribution member, and the heating member comprises a first heating element at an upper surface of the air flow redistribution member.

3. The apparatus of claim 1, wherein the heating member comprises a second heating element at a sidewall of the air flow redistribution member.

4. The apparatus of claim 1, further comprising a controller connected to the heating member.

5. The apparatus of claim 1, wherein the air flow redistribution member further comprises:
    a third air flow redistribution plate between the second air flow redistribution plate and the exhaust member, wherein the heating member is between the second air flow redistribution plate and the third air flow redistribution plate from a top view perspective.

6. The apparatus of claim 5, wherein the heating member is closer to the second air flow redistribution plate than the third air flow redistribution plate.

7. An apparatus for fabricating a semiconductor structure, comprising:
    a chamber;
    an exhaust member connected to the chamber; and
    an air flow redistribution member connected to the exhaust member, configured to receive an air flow at a first end and eject the air flow at a second end, the air flow redistribution member comprising:
        a first air flow redistribution plate extending in a vertical direction; and
        a second air flow redistribution plate between the first air flow redistribution plate and the second end.

8. The apparatus of claim 7, further comprising a heating member disposed at a surface of the air flow redistribution member.

9. The apparatus of claim 7, wherein the second air flow redistribution plate is disposed separately from the first air flow redistribution plate along a primary direction of the air flow.

10. The apparatus of claim 9, wherein the first air flow redistribution plate comprises a first opening area and a first closed area, and the second air flow redistribution plate comprises a second opening area and a second closed area, wherein the first opening area corresponds to the second closed area.

11. The apparatus of claim 10, wherein the first closed area corresponds to the second opening area.

12. The apparatus of claim 10, wherein the second opening area comprises an upper opening and a lower opening disposed along a secondary direction perpendicular to the primary direction.

13. The apparatus of claim 12, further comprising a third air flow redistribution plate disposed separately from the second air flow redistribution plate along the primary direction.

14. The apparatus of claim 13, wherein the third air flow redistribution plate comprises a left opening and a right opening disposed along a tertiary direction perpendicular to the primary direction and the secondary direction.

15. The apparatus of claim 7, further comprising an exhaust member connected to the second end of the air flow redistribution member.

16. An apparatus for fabricating a semiconductor structure, comprising:
    a chamber;
    an exhaust member connected to the chamber; and
    an air flow redistribution member connected to the exhaust member, configured to receive an air flow at a first end and eject the air flow at a second end, the air flow redistribution member comprising:
        an opening at a first level and proximal to the first end; and
        a stripe apart from the first end and positioned at the first level.

17. The apparatus of claim 16, further comprising a heating member disposed at a surface of the air flow redistribution member.

18. The apparatus of claim 16, further comprising a hot plate in the chamber and proximal to the opening.

19. The apparatus of claim 16, wherein the opening extends along a first direction.

20. The apparatus of claim 19, wherein the stripe extends along the first direction.

* * * * *